United States Patent [19]

Yu

[11] Patent Number: 5,696,506

[45] Date of Patent: Dec. 9, 1997

[54] APPARATUS FOR VARIABLE-LENGTH DECODING IMAGE SIGNALS USING A RUN EQUIVALENT SIGNAL

[75] Inventor: Pil-ho Yu, Suwon, Rep. of Korea

[73] Assignee: Samsung Electronics, Co., Ltd., Kyungki-do, Rep. of Korea

[21] Appl. No.: 436,866

[22] Filed: May 8, 1995

[30] Foreign Application Priority Data

May 6, 1994 [KR] Rep. of Korea ................... 94-9922

[51] Int. Cl.⁶ ..................................... H03M 7/40
[52] U.S. Cl. ............................................. 341/67
[58] Field of Search ............................ 341/65, 67, 63

[56] References Cited

U.S. PATENT DOCUMENTS

| | | | |
|---|---|---|---|
| 5,173,695 | 12/1992 | Sun et al. | 341/67 |
| 5,245,338 | 9/1993 | Sun | 341/67 |
| 5,369,405 | 11/1994 | Choi et al. | 341/63 |
| 5,432,512 | 7/1995 | Park | 341/67 |

OTHER PUBLICATIONS

Shaw-min Lei and Ming-Ting Sun, "An Entropy Coding System For Digital HDTV Applications", IEEE Transactions On Circuits And Systems For Video Technology, pp. 147-155, vol. 1, No. 1 Mar. 1991.

Primary Examiner—Jeffrey A. Gaffin
Assistant Examiner—Thuy-Trang N. Huynh
Attorney, Agent, or Firm—Sughrue, Mion, Zinn, Macpeak & Seas, PLLC

[57] ABSTRACT

An apparatus for decoding variable-length codewords has a FIFO memory which stores a bitstream and outputs an N-bit sequence from the first bit position in the stored bitstream in response to a carry signal. The number of bits "N" corresponds to the longest variable-length codeword. A barrel shifter receives part of a 2N-bit sequence in response to the carry signal, and outputs an N-bit sequence in response to the accumulated codeword length. Another barrel shifter outputs an N-bit sequence in response to the codeword length for storing the 2N-bit sequence from the first barrel shifter. The decoder generates a run-length and a level corresponding to a variable-length codeword starting at a first bit position in the N-bit sequence. The decoder generates a second run equivalent signal during a run-length interval, and then outputs data of "0" in response to the second run equivalent signal, and outputs a level in response to the first run equivalent signal. A codeword length generator generates a codeword corresponding to the first variable-length codeword in the output of the second barrel shifter. An operator adds and modulo-N-operates a previously accumulated codeword length and a codeword length from the codeword length generator and outputs the residue as an accumulated codeword length and the quotient as a carry signal.

8 Claims, 4 Drawing Sheets

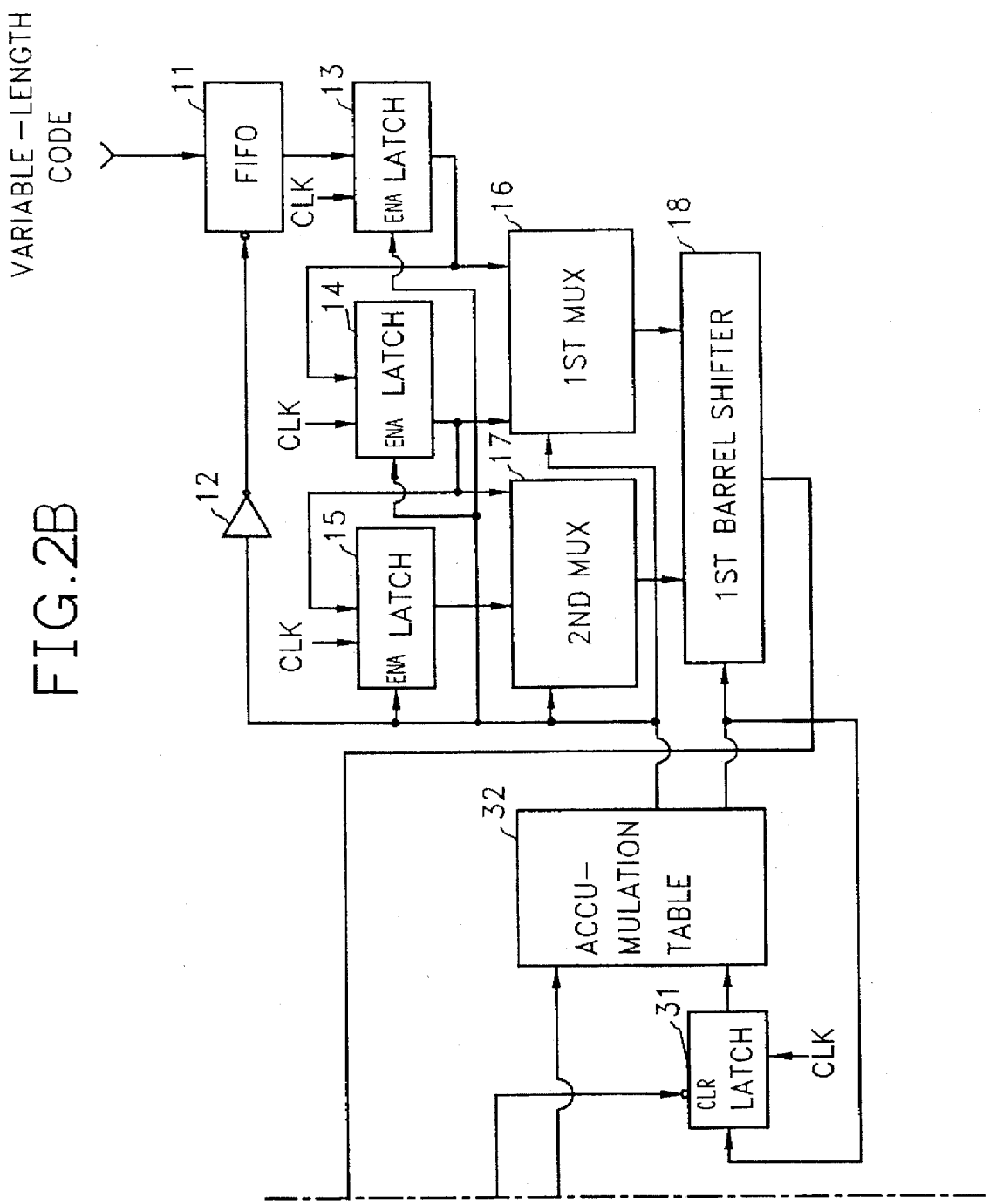

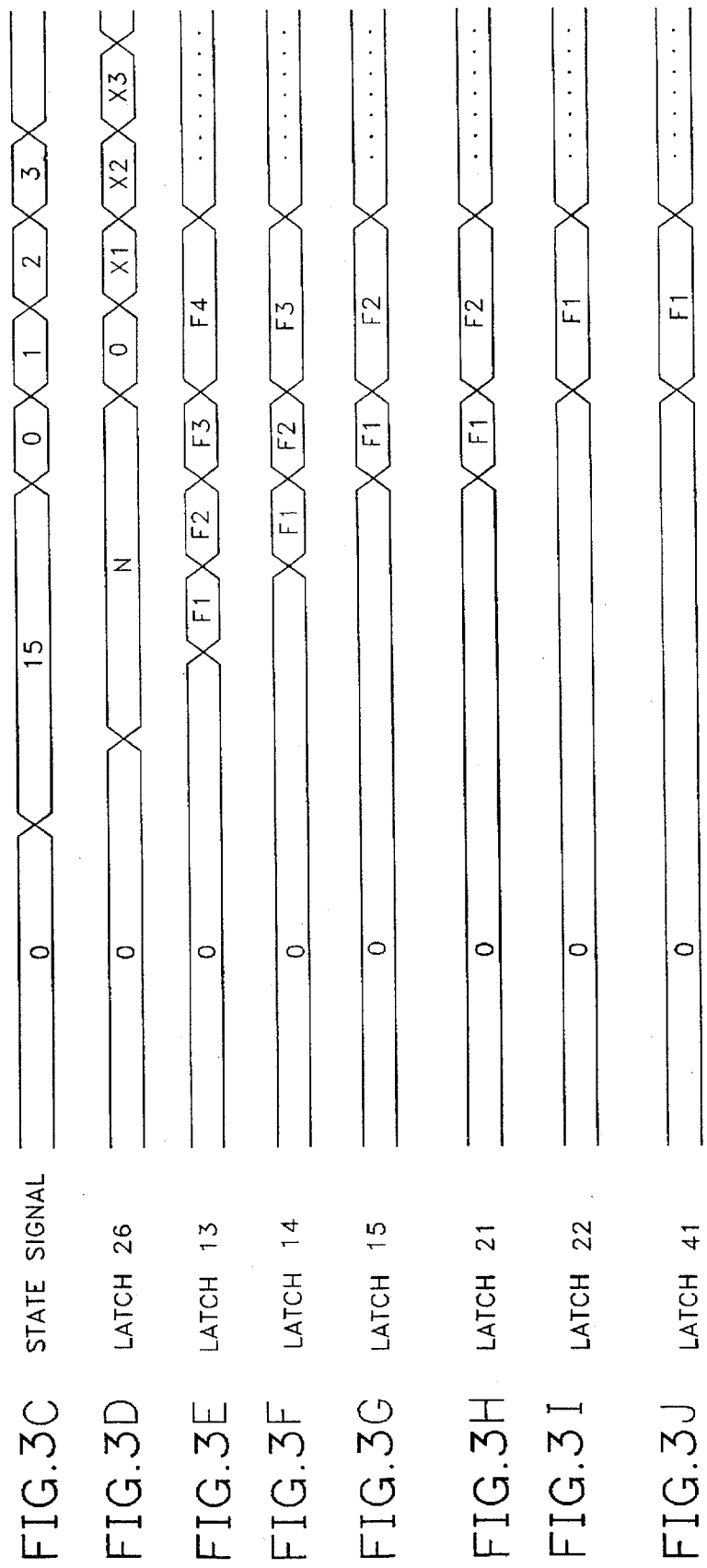

APPARATUS FOR VARIABLE-LENGTH DECODING IMAGE SIGNALS USING A RUN EQUIVALENT SIGNAL

BACKGROUND OF THE INVENTION

1. Field of the Invention

The present invention relates to a variable-length decoder for a data transmission system requiring a high signal processing frequency, and more particularly to a variable-length decoder for decoding a variable-length-coded codeword of an image signal into a prior-to-be-encoded code.

2. Description of Related Art

In a high-definition television (HD-TV), a high-definition video tape recorder (HD-VTR), a digital VTR, a digital camcorder or a multimedia system, both a video signal and an audio signal are converted into digital signals, and the digitally converted signals are transmitted or stored in a recording medium. Then the transmitted or stored signals are decoded and reproduced. Such an encoding and decoding system requires a compression technology for compressing a large amount of transmission data to maximize data transmission efficiency. As generally-used methods for encoding video signals are a transformation encoding method, a differential pulse code modulation (DPCM) method, a vector quantization method, and a variable-length encoding method. These encoding methods are used to reduce a total amount of data by removing redundancy data included in digital signals.

The variable-length encoding method among the above encoding methods includes a run-length encoding step and a modified Huffman encoding step. In the run-length encoding step, the number of continuous zeros is represented as run-lengths to reduce the number of samples. The run-length is the number of continuous zeros generated in the run-length encoding step, and a magnitude or a level of a non-zero sample corresponds to a signal codeword. For example, when certain data is input in a sequence of "a, 0, 0, b, 0, 0, 0, 0, c, d, 0, e . . . " where a, b, c, d and e are not equal to zero, the run-length encoded data is as follows: "[0, a], [2, b], [4, c], [0, d], [1, e], . . . ". Here, [0, a] represents that there are no zeros before the non-zero first level "a", and [2, b] represents that there are two zeros before the non-zero second level "b". As described above, the run-length encoded data is assigned with a short-length codeword in case of a high frequency of occurrence, and a long-length codeword in case of a low frequency of occurrence, according to a Huffman code table. Then, since it is not proper to lengthen the run-length without limitation, a variable-length coding is performed in a unit of a certain block. A bitstream of the variable-length-coded data includes a code for representing a start of a certain interval, a code for representing an end of a certain interval, a code for representing a video signal, a code for representing an end of block (EOB), a variety of control codes, and a state indication code. The state indication code represents what kind of property each code included in the bitstream has. That is, the state indication code has information for discerning the patterns of the codes constituting the bitstream from each other.

FIG. 1 shows a conventional variable-length decoder for decoding variable-length-coded data. The FIG. 1 decoder is disclosed in more detail in "An Entropy Coding System For Digital HDTV Applications" (IEEE Transactions On Circuits And Systems For Video Technology, pp. 147–155, Vol. 1., No. 1, March 1991, by Shaw-min Lei and Ming-Ting Sun). Thus, an operation of the FIG. 1 apparatus will be simply described below.

In FIG. 1, the variable-length-coded data is stored in a buffer (not shown). The buffer outputs N-bit data to a first register 1 whenever a read signal is input thereto from a codeword length accumulator 5. First register 1 latches the N-bit variable-length-coded data output from the buffer whenever the read signal is input thereto from codeword length accumulator 5. A second register 2 latches the N-bit variable-length-coded data output from first register 1. A barrel shifter 3 receives the outputs of first and second registers 1 and 2, and outputs the received signals according to the length of the accumulated codeword output from codeword length accumulator 5. More specifically, barrel shifter 3 outputs the N-bit data stored in a window shifted by the codeword length accumulated in codeword length accumulator 5 to a programmable logic array (PLA) 4. PLA 4 decodes the N-bit variable-length-coded data output from barrel shifter 3, and outputs a codeword length which is the number of the bits used for decoding, to codeword length accumulator 5. PLA 4 outputs a symbol and a code length of the symbol. Codeword length accumulator 5 adds the codeword length applied from PLA 4 to the stored accumulated codeword length, and produces a newly accumulated codeword length. Codeword length accumulator 5 generates a read signal if the newly produced accumulated codeword length is larger than or equal to N bits, and subtracts the number of bits N from the accumulated codeword length to calculate the accumulated codeword length to be supplied to barrel shifter 3. Codeword length accumulator 5 outputs, however, the accumulated codeword length to barrel shifter 3 if the accumulated codeword length is smaller than N bits. Barrel shifter 3 outputs the data in a window shifted by the accumulated codeword length supplied from codeword length accumulator 5 among the 2N-bit data supplied from registers 1 and 2, to PLA 4. Detailed descriptions of the FIG. 1 apparatus, including the operation of barrel shifter 3, are provided in the above-cited Shaw-min Lei and Ming-Ting Sun reference.

On the other hand, U.S. Pat. No. 5,245,338 to Ming-Ting Sun issued on Sep. 14, 1993 entitled "High-Speed Variable-Length Decoder" discloses a high-speed variable-length decoder capable of being used in a high-speed system such as a HD-TV.

SUMMARY OF THE INVENTION

It is an object of the present invention to provide a decoding apparatus for decoding variable-length-coded data having a different constitution from that of the disclosed prior art.

To accomplish the above object of the present invention, there is provided a variable-length decoder for image signals comprising:

a decoder for generating a run-length and level corresponding to a variable-length code starting at a first bit position in an N-bit sequence having the longest variable-length codeword of at least bit number N in a bitstream, generating a first length run equivalent signal until the number of clock pulses coinciding with the run-length is input thereto, generating a second run equivalent signal if the number of the clock pulses coincides with the run-length, storing the generated level in response to the first run equivalent signal, and outputting the generated level in response to the second run equivalent signal, to thereby decode each variable-length codeword in the input bitstream based on a clock pulse generated according to a constant clock pulse rate;

first bit storage means coupled to the decoder so as to supply the stored N-bit sequence, for storing the N-bit input sequence for each clock pulse during an input of the second run equivalent signal from the decoder, and keeping the stored N-bit sequence for each clock pulse during an input of the first run equivalent signal;

codeword length generating means for receiving the N-bit sequence supplied to the first bit storage means and generating and outputting a codeword length corresponding to a variable-length codeword starting at a first bit position in the N-bit sequence for each clock pulse during an input of the second run equivalent signal from the decoder;

accumulation operation means for adding a previous accumulated codeword length to the codeword length supplied from the codeword length generation means, dividing the added result by the number of bits N, outputting an accumulated codeword length being a residue according to the divided result, and generating and outputting a carry signal if a quotient exists;

a buffer for storing the input bit stream, and sequentially outputting the N-bit sequence from the first bit position in the stored bitstream in response to the carry signal from the accumulation operation means;

second bit storage means for storing at least sequential 2N-bit sequences output from the buffer in response to the carry signal output from the accumulation operation means;

first shifter means for outputting an N-bit sequence starting at a bit position shifted by the accumulated codeword length starting at the first bit position among at least 2N-bit sequences stored in the second bit storage means in response to the carry signal and the accumulated codeword length;

third bit storage means for storing the N-bit sequence from the first shifter means for each clock pulse;

fourth bit storage means for storing the N-bit sequence supplied to the first storage means for each clock pulse; and second shifter means for outputting an N-bit sequence having a first bit at a bit position shifted by a codeword length output from the codeword length generation means, from the first bit position among the 2N-bit sequences constructed so that the N-bit sequence stored in the fourth bit storage means is earlier than that of the N-bit sequence stored in the third bit storage means, to the first bit storage means, the fourth bit storage means and the codeword length generation means.

BRIEF DESCRIPTION OF THE DRAWINGS

FIGS. 2A and 2B are a block diagram of a variable-length decoder according to a preferred embodiment of the present invention.

FIGS. 3A through 3J are timing diagrams for explaining the operation of the FIG. 2 apparatus.

DETAILED DESCRIPTION OF THE PREFERRED EMBODIMENT

Figure 1:
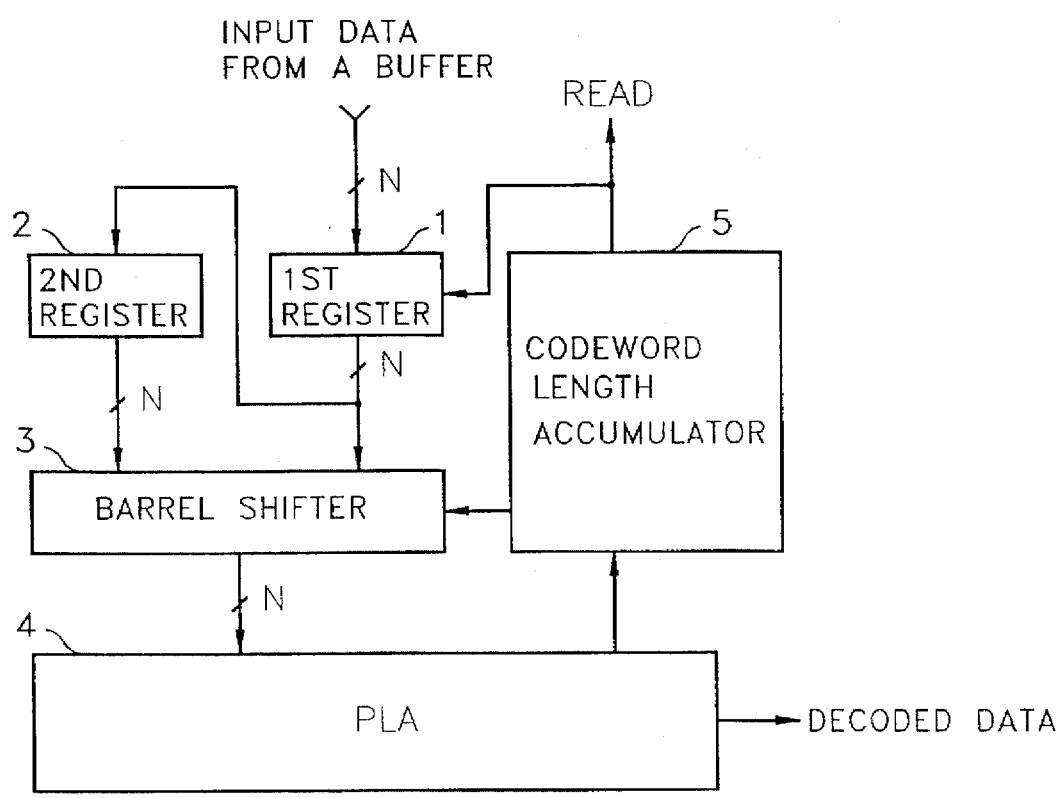
FIG. 1 is a block diagram of a conventional variable-length decoder for decoding variable-length-coded data.
Figure 2A:
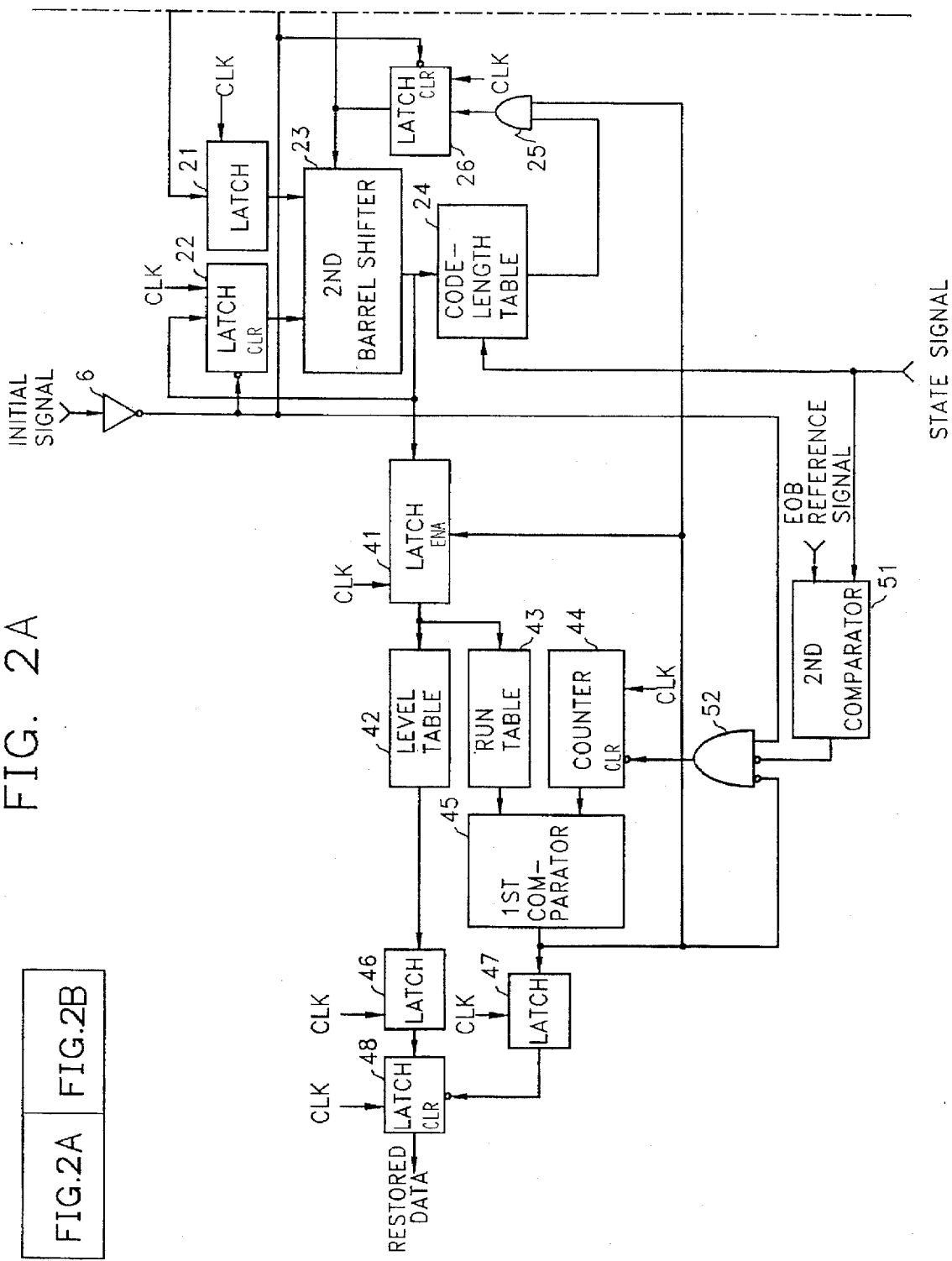

A preferred embodiment of the present invention will be described below in more detail with reference to the accompanying FIGS. 2A and 2B, and 3A through 3J.

The FIG. 2 variable-length decoder decodes a variable-length-codeword which is variable-length-coded data into a prior-to-be-encoded state. More specifically, the variable-length decoder generates a level delayed by a run-length using variable-length-coded codewords of the video signal. Thus, the FIG. 2 variable-length decoder outputs data which can be used for an inverse transformation encoding operation.

The variable-length codewords are input to a first-in-first-out (FIFO) memory 11 in a serial or parallel pattern. FIFO memory 11 stores the input variable-length codewords, and outputs the firstly input N-bit data among the stored data to a latch 13, whenever a carry signal of "0" is applied thereto from an inverter 12. FIFO memory 11 outputs in a parallel pattern each N-bit sequence of bits input in a serial or parallel pattern. Accordingly, the most significant bit among the N-bit data output from FIFO memory 11 becomes the earliest bit among the identical N-bit data in the serial bitstream. Here, the number of bits "N" is the number of bits which the longest variable-length codewords can have. Thus, only one or two variable-length codewords can exist in the N-bit sequence. With a clock pulse input, latch 13 latches the N-bit sequence output from FIFO memory 11, latch 14 latches the data from latch 13 and latch 15 latches the data supplied from latch 14. These latches 13, 14 and 15 latch the supplied N-bit sequence according to a clock pulse input during an input of the carry signal of "1". A first multiplexer 16 selects the output of latch 13 when the carry signal is "1", and selects the output of latch 14 when the carry signal is "0", to supply the selected signal to a barrel shifter 18. A second multiplexer 17 selects the output of latch 14 when the carry signal is "1", and selects the output of latch 15 when the carry signal is "0", to supply the selected signal to a barrel shifter 18. Barrel shifter 18 outputs the N-bit data in the window shifted by the number of bits corresponding to the accumulated codeword length (ACL) among the 2N-bit sequence supplied from multiplexers 16 and 17, to a latch 21. Here, the window shifting is performed by shifting the window by the ACL from the first bit of the N-bit sequence applied from the multiplexer 17. For example, when the ACL is "m", barrel shifter 18 outputs N-m bits except for m bits from the first bit in the N-bit sequence supplied from multiplexer 17 and m bits from the first bit in the N-bit sequence applied from multiplexer 16, to latch 21. Latch 21 latches the data supplied from barrel shifter 18 whenever a clock pulse is input thereto. Latch 22 latches the data supplied from barrel shifter 23 which operates in the same way as that of barrel shifter 18 whenever a clock pulse is input thereto. Barrel shifter 23 outputs the N-bit sequence existing in the shifted window by a codeword length (CL) among the 2N-bit sequence supplied from latches 21 and 22, codeword length table 24 and latch 41.

Codeword length table 24 outputs either a first variable-length codeword length supplied from barrel shifter 23 according to a state signal value or a codeword length corresponding to the state signal value, to an AND gate 25. The state data used in the preferred embodiment of the present invention is four-bit data. Codeword length table 24, designed to output a codeword of "0" if the state signal value is "0", outputs a codeword length obtained from the output data of barrel shifter 23 if the state signal value is between "1" and "14" and outputs a codeword of "N" if the state signal value is "15". The state signal value between "1" and "14" is used for discerning various codeword length tables. Such a state signal is supplied from an external apparatus (not shown) in an initial interval, that is, for a five clock pulse interval before the FIG. 2 apparatus normally operates on the basis of the codeword length and the run-length obtained from the variable-length codeword. Also, the state signal generated when the FIG. 2 apparatus normally operates uses a codeword length obtained from codeword length table 24, or it can be supplied from the external apparatus (not shown) in the same way as that of the initial interval. AND gate 25 supplies the codeword length from codeword length table 24 to a latch 26 when a run equivalent signal of "1" is applied from a comparator 45, and supplies a value of "0" to a latch 26 when a run equivalent of "0" is applied from comparator 45. Latch 26 latches the data supplied from AND gate 25 according to a clock pulse. Barrel shifter 23 shifts the window which determines the data output according to the codeword length from latch 26.

The codeword length stored in latch 26 is supplied to accumulation operator 32. A latch 31 latches the accumulated codeword length output from accumulation operator 32 according to a clock pulse. Accumulation operator 32 adds the codeword length supplied from latch 26 to the accumulated codeword length supplied from latch 31. Also, accumulation operator 32 modulo-N-operates the added result value, and outputs the quotient as a carry signal and the residue as an accumulated codeword length. That is, accumulation operator 32 outputs a carry signal of "1" and the accumulated codeword length which is the residue resulting from the modulo-N-operation if a newly obtained accumulated codeword length is larger than or equal to "N", whereas accumulation operator 32 outputs a carry signal of "0" and the accumulated codeword length which is the residue resulting from the modulo-N-operation if a newly obtained accumulated codeword length is smaller than "N". The accumulated codeword length output from accumulation operator 32 is supplied to latch 31 and barrel shifter 18, and the carry signal is supplied to inverter 12, latches 13, 14 and 15, and multiplexers 16 and 17. On the other hand, latches 22, 26 and 31 are cleared by an initializing signal input to a low-edge trigger type clear end via inverter 6.

Latch 41 is enabled according to a run equivalent signal applied from comparator 45, and latches the N-bit sequence supplied from barrel shifter 23 when a clock pulse is input thereto. That is, latch 41 latches the N-bit sequence from barrel shifter 23 according to a clock pulse input thereto, when the run equivalent signal is "1". A level table 42 outputs a level corresponding to a first variable-length codeword existing in the N-bit sequence supplied from latch 41. This level is supplied to latch 46, and the level latched in latch 46 is supplied to a latch 48 when a clock pulse is input thereto. On the other hand, a run table 43 outputs a run-length corresponding to a first variable-length codeword existing in the N-bit sequence supplied from latch 41. A comparator 45 compares the run-length from run table 43 with the counted value from a counter 44. Comparator 45 outputs a run equivalent signal of "1" if the run-length coincides with the counted value, while the comparator 45 outputs a run equivalent signal of "0" if it does not. The run equivalent signal which is the output of comparator 45 is supplied to latches 41 and 47, gate circuit 52 and AND gate 25, respectively. A latch 47 latches the run equivalent signal from comparator 45 according to a clock pulse. The output of latch 47 is used as a clear signal of a latch 48. Thus, latch 48 outputs a value of "0", according to a clock pulse input, if a value of "0" is applied from latch 47, while latch 48 latches a level supplied from latch 46 if a value of "1" is applied thereto.

A comparator 51 compares the state signal with the block end signal (EOB) and outputs the comparison result to a gate circuit 52. The comparator 51 outputs "1" if the EOB is equal to the state signal, and outputs "0" if not. The variable-length decoding with respect to a new block is normally performed by the output of comparator 51. Gate circuit 52 receives the inverted signal of the run equivalent signal, the inverted signal of the output of comparator 51 and the initializing signal, logically multiplies the received signals by each other and outputs the result to a counter 44. Counter 44 is an increment counter for counting the number of the clock pulse and is designed to receive the output signal of gate circuit 52 as a clear signal. Thus, counter 44 is cleared by a run equivalent signal of "1" generated from comparator 45 when the run-length coincides with the counted value. Counter 44 counts the number of clock pulses until the counted value coincides with the run length.

The operation of the FIG. 2 apparatus having the above-described construction will be described below with reference to FIGS. 3A through 3J.

An initializing signal of FIG. 3B has a high-level before a first clock pulse CLK1 is activated. The value of the state signal (FIG. 3C) is "15" when first clock pulse CLK1 through fourth clock pulse CLK4 are activated, is "0" when fifth clock pulse CLK5 is activated, and is varied according to the output of barrel shifter 23 after seventh clock pulse CLK7 is activated. For convenience, FIFO memory 11 is defined so that the N-bit data is output in sequence of F1, F2, F3, F4, . . . whenever the carry signal generated by accumulation operator 32 becomes "1".

The variable-length codeword of the serial bitstream is input and stored in FIFO memory 11 before the first clock pulse is activated. The initalizing signal of FIG. 3B is applied to the FIG. 2 apparatus via inverter 6. Latches 22, 26 and 31 are cleared by the initializing signal, and gate circuit 52 outputs a value of "0" during a high-level interval of the initializing signal. Counter 44 is cleared by a signal value of "0" from gate circuit 52. Accordingly, latch 26 outputs a codeword length of "0" as shown in FIG. 3D. The output "0" of latch 26 is output to accumulation operator 32. Accumulation operator 32 adds the output of latch 31 cleared by the initializing signal to the output of latch 26 and then performs a modulo-N-operation. In this case, since the output of latch 31 is "0", accumulation operator 32 outputs carry signal "0" and the accumulated codeword length "0" FIFO memory 11 and latches 13, 14 and 15 do not operate by carry signal "0". The outputs of latches 26, 13, 14, 15, 21, 22 and 41 are all "0" before the first clock pulse is activated, as shown in FIGS. 3D through 3J. On the other hand, comparator 45 outputs run equivalent signal "1" which is input to AND gate 25. Here, the state signal has a value of "15" as shown in FIG. 3C. Also, codeword length table 24 outputs codeword length "N" to AND gate 25 in response to state signal "15". AND gate 25 outputs codeword length "N" output from codeword length table 24 since the run equivalent signal output from comparator 45 is "1".

When first clock pulse CLK1 is activated, latch 26 latches the codeword length "N" output from AND gate 25. Accumulation operator 32 adds the output "0" from latch 31 to the output "N" output from latch 26, and then outputs carry signal "1" by the modulo-N-operation of the result "N" and the accumulated codeword length "0". FIFO memory 11 outputs firstly input N-bit data "F1" among the stored data to latch 13 according to the carry signal inverted by inverter 12. After first clock pulse CLK1 is activated, the data latched in latches 13, 14, 15, 21, 22 and 41 are all "0" as shown in FIGS. 3E through 3J, respectively. On the other hand, comparator 45 outputs run equivalent signal "1" since a run-length is not supplied from run table 43. The run equivalent signal "1" is supplied to AND gate 25, which enables AND gate 25 to supply the output of codeword length table 24 to latch 26.

The FIG. 2 apparatus operates in this manner with respect to the second clock pulse CLK2 and third clock pulse CLK3. Then, if fifth clock pulse CLK5 is activated, latch 21 latches the data "F1" output from barrel shifter 18. Latch 15 latches the data "F1" output from latch 14. Latch 14 latches the data "F2" output from latch 13. Latch 13 latches the data "F3" output from FIFO memory 11. Here, since latch 26 latches the output "N" of AND gate 25, barrel shifter 23 outputs the N-bit sequence in the window shifted by codeword length "N" output from latch 26, that is, data "F1" output from latch 21 to codeword length table 24 and latches 22 and 41, respectively. On the other hand, accumulation operator 32 outputs carry signal "1" and accumulated codeword length "0" according to the output "N" of latch 26 and the output "0" of latch 31. FIFO memory 11 outputs next N-bit data "F4" in response to carry signal "1" from accumulation operator 32. Multiplexer 16 supplies data "F3" from latch 13 to barrel shifter 18 in response to carry signal "1" Multiplexer 17 supplies data "F2" from latch 14 to barrel shifter 18 in response to carry signal "1". Barrel shifter 18 outputs data "F2" from multiplexer 17 to latch 21 in response to the accumulated codeword length "0" from accumulation operator 32. Codeword length table 24 outputs codeword length "0" according to the state signal value "0" when fourth clock pulse CLK4 is activated, to AND gate 25. AND gate 25 outputs codeword "0" to latch 26 according to run equivalent signal "1".

When fifth clock pulse CLK5 is activated, latch 41 latches the data "F1" output from barrel shifter 23. Level table 42 outputs a level corresponding to a first variable-length codeword existing in the N-bit sequence "F1". Run table 43 receives data "F1" from latch 41 and outputs a run-length corresponding to a level output from level table 42 to comparator 45. Comparator 45 compares the run-length with the output "0" of counter 44, to thereby output run equivalent signal "1" if both are same, and to thereby output run equivalent signal "0" if not. In the preferred embodiment of the present invention, a run-length corresponding to the level first output from level table 42 is defined as "0". Thus, comparator 45 outputs run equivalent signal "1". The run equivalent signal "1" is supplied to latches 41 and 47, gate circuit 52 and AND gate 25, respectively.

On the other hand, latch 22 latches the data "F1" output from barrel shifter 23 according to fourth clock pulse CLK4. Latch 21 latches the data "F2" output from barrel shifter 18. Latch 15 latches the data "F2" output from latch 14. Latch 14 latches the data "F3" output from latch 13. Latch 13 latches the data "F4" output from FIFO memory 11. Here, since latch 26 latches the codeword length "0" output from AND gate 25, barrel shifter 23 outputs data "F1" output from latch 22 to codeword length table 24 and latches 22 and 41, respectively, in response to the output "0" of latch 26. Here, as the state signal, codeword length table 24 outputs codeword length "X1" corresponding to the first variable-length codeword existing in the data "F1" applied from barrel shifter 23 as shown in FIG. 3C. Thus, codeword length table 24 outputs codeword length "X1" corresponding to the first variable-length codeword existing in the data "F1". AND gate 25 outputs codeword "X1" from codeword length table 24 to latch 26 according to run equivalent signal "1" applied from comparator 45.

Accumulation operator 32 performs an addition and a modulo-N-operation with respect to the output "0" of latch 26 and the output "0" of latch 31 according to the activation of fourth clock pulse CLK4, and outputs carry signal "0" and accumulated codeword length "0" according to the operation result. Thus, FIFO memory 11 does not output any data in response to carry signal "0". Then, in response to carry signal "0", multiplexer 16 transfers the output "F3" of latch 14 to barrel shifter 18, while multiplexer 17 transfers the output "F2" of latch 15 to barrel shifter 18. Barrel shifter 18 outputs data "F2" output from latch 15 in response to accumulated codeword length "0".

When sixth clock pulse CLK6 is activated, latch 46 latches the level output from level table 42, while latch 47 latches run equivalent signal "1" from comparator 45. Latch 41 latches data "F1" supplied from barrel shifter 23 in response to run equivalent signal "1". Level table 42 outputs a level corresponding to a first variable-length codeword existing in the data "F1". Run table 43 receives data "F1" from latch 41 and outputs a run-length corresponding to a level output from level table 42 to comparator 45. Comparator 45 compares the run-length with the output "0" of counter 44, to thereby output run equivalent signal "1" according to the comparison result. The run equivalent signal "1" is supplied to latches 41 and 47, gate circuit 52 and AND gate 25, respectively.

On the other hand, latch 22 latches the data "F1" output from barrel shifter 23 according to fifth clock pulse CLK5. Latch 21 latches the data "F2" output from barrel shifter 18. Also, latch 15 has the data "F2" output from latch 14. Latch 14 has the data "F3" output from latch 13. Latch 13 has the data "F4" output from FIFO memory 11. Also, FIFO memory 11 does not output any data since the carry signal value is "0" when the sixth clock pulse CLK6 is activated. Since latch 26 latches the output "X1" from AND gate 25 by the fifth clock pulse CLK5, barrel shifter 23 shifts the window by bits "X1" and outputs the N-bit data in the shifted window to codeword length table 24 and latches 22 and 41, respectively, in response to the output "X1" of latch 26. Thus, in this case, the output of barrel shifter 23 consists of bits from which the first variable-length codeword in the bitstream applied to FIFO memory 11 is excluded. The output of barrel shifter 23 is supplied to latches 22 and 41 and codeword length table 24. Codeword length table 24 outputs codeword length "X2" corresponding to the first variable-length codeword existing in the data output from barrel shifter 23. AND gate 25 outputs codeword "X2" output from codeword length table 24 to latch 26 in response to run equivalent signal "1".

Accumulation operator 32 performs an addition and a modulo-N-operation with respect to the output "X1" of latch 26 and the output "0" of latch 31, and outputs the carry signal and the accumulated codeword length according to the operation result. In this case, the carry signal and accumulated codeword length output from accumulation operator 32 is determined by codeword "X1". If codeword length "X1" is larger than "N", an accumulated codeword length which is a residue obtained by dividing carry signal "1" and codeword length "X1" by "N", is generated. On the other hand, if codeword length "X1" is smaller than "N", the carry signal becomes "0" and codeword length "X1" becomes the accumulated codeword length output from accumulation operator 32. In response to the carry signal from accumulation operator 32, multiplexer 16 individually outputs the N-bit sequence from one of latches 13 and 14, while multiplexer 17 individually outputs the N-bit sequence from one of latches 14 and 15. Barrel shifter 18 shifts the window in response to the accumulated codeword length output from accumulation operator 32, and outputs the N-bit sequence in the shifted window to latch 21.

If a seventh clock pulse CLK7 is activated, latch 48 latches the level supplied from latch 46 in response to run equivalent signal "1" stored in latch 47. Here, the data latched in latch 48 is a level corresponding to the first variable-length codeword in the bitstream applied to FIFO memory 11. Latch 46 again latches a level corresponding to the above-described first variable-length codeword. Latch 47 latches a run-length corresponding to the variable-length codeword. Latch 41 latches the N-bit data including bits from which the first variable-length codeword in the bitstream is excluded in response to run equivalent signal "1". The data latched in latch 41 is data corresponding to codeword "X2" output from codeword length table 24 by sixth clock pulse CLK6. Level table 42 outputs a level corresponding to the first variable-length codeword existing in the data output from latch 41. Run table 43 outputs a run-length corresponding to the level. Here, the value supplied from counter 44 to comparator 45 becomes "0", since counter 44 is in the cleared state by the previous run equivalent signal "1". Comparator 45 compares the output of run table 43 with the output of counter 44. Comparator 45 outputs a run equivalent signal of "1" or "0" according to the comparison result to latches 41 and 47, gate circuit 52 and AND gate 25. Comparator 45 outputs a run equivalent signal of "0" when the run-length output from run table 43 is not equal to the counted value output from counter 44. When the run-length corresponding to the level output from level table 42 is not "0" according to the run equivalent signal "0" output from comparator 45, latch 41 maintains the data latched by the number of clock pulses corresponding to the run-length. Latch 22 also continuously latches the data according to the number of clock pulses corresponding to the run-length. If the run equivalent signal is "0", the data supplied to latch 26 also becomes "0". Thus, barrel shifters 18 and 23 acquire the data identical to the output data generated when the previous clock pulse is activated.

When the state signal equals block end signal EOB, the output of comparator 51 clears counter 44. The FIG. 2 apparatus performs a normal decoding operation with respect to a new block according to the clear operation of the counter 44.

The FIG. 2 apparatus repeats the above-described procedures to decode the variable-length codewords existing in the bitstream. Thus, the operation of the FIG. 2 apparatus will be apparent to a person having ordinary skill in the art from the above-described embodiment.

As described above, the variable-length decoder according to the present invention can variable-length-decode the variable-length-coded codewords of the image signals at a high signal processing frequency. The variable-length decoder generates as data a number of "zeros" corresponding to the run-lengths and the following level, instead of generating a symbol corresponding to the variable-length codeword, thereby decoding the transformation-coded and variable-length-coded image signals at a signal processing frequency which is required in the HD-TV system as well. Also, since the operation of the system should be delayed according to the run equivalent signal, a scope of the usable hardware, which has been restricted by the signal processing frequency, can be broadened.

What is claimed is:

1. A variable-length decoder for image signals comprising:

a decoder for generating a run-length and level corresponding to a variable-length code starting at a first bit position in an N-bit sequence having the longest variable-length codeword of at least bit number N in an input bitstream, generating a first run equivalent signal until a number of clock pulses coinciding with the run-length is input thereto, generating a second run equivalent signal if the number of the clock pulses coincides with the run-length, storing the generated level in response to the first run equivalent signal, and outputting the generated level in response to the generated second run equivalent signal, to thereby decode each variable-length codeword in the input bitstream based on a clock pulse generated according to a constant clock pulse rate;

first bit storage means coupled to the decoder so as to supply a stored N-bit sequence, for storing the N-bit input sequence for each clock pulse during an input of the second run equivalent signal from the decoder, and keeping the stored N-bit sequence for each clock pulse during an input of the first run equivalent signal;

codeword length generating means for receiving the N-bit sequence supplied to the first bit storage means and generating and outputting a codeword length corresponding to a variable-length codeword starting at a first bit position in the N-bit sequence for each clock pulse during an input of the second run equivalent signal from the decoder;

accumulation operation means for adding a previous accumulated codeword length to the codeword length supplied from the codeword length generation means, dividing the added result by the number of bits N, outputting an accumulated codeword length which is a residue according to the divided result, and generating and outputting a carry signal if a quotient exists;

a buffer for storing the input bitstream, and sequentially outputting the N-bit sequence from the first bit position in the stored bitstream in response to the carry signal from the accumulation operation means;

second bit storage means for storing at least a 2N-bit sequence output from the buffer in response to the carry signal output from the accumulation operation means;

first shifter means for outputting an N-bit sequence starting at a bit position shifted by the accumulated codeword length starting at a first bit position of the at least 2N-bit sequence stored in the second bit storage means in response to the carry signal and the accumulated codeword length;

third bit storage means for storing the N-bit sequence output by the first shifter means for each clock pulse;

fourth bit storage means for storing the N-bit sequence supplied to the first bit storage means for each clock pulse; and second shifter means for outputting an N-bit sequence having a first bit at a bit position shifted by a codeword length output from the codeword length generation means, from the first bit position of the 2N-bit sequence constructed so that the N-bit sequence stored in the fourth bit storage means is earlier than that of the N-bit sequence stored in the third bit storage means, to the first bit storage means, the fourth bit storage means and the codeword length generation means.

2. The variable-length decoder according to claim 1, wherein said codeword length generation means comprises:

a codeword length table for outputting a codeword length corresponding to a variable-length codeword starting at the first bit position of the N-bit sequence from said second shifter means;

a gate circuit for outputting the codeword length from said codeword length table when said second run equivalent signal is applied thereto; and a fourth latch for storing the codeword length from said gate circuit for each clock pulse.

3. The variable-length decoder according to claim 2, wherein said codeword length table outputs a codeword length so that the first N-bit sequence in the bitstream is stored in said third bit storage means within a five-clock pulse interval from an initial state.

4. The variable-length decoder according to claim 1, wherein said second bit storage means comprises:
- a fifth latch for storing the N-bit sequence from said buffer for each clock pulse in response to the carry signal;
- a sixth latch for storing the N-bit sequence from said fifth latch for each clock pulse in response to the carry signal; and
- a seventh latch for storing the N-bit sequence from said sixth latch for each clock pulse in response to the carry signal, and wherein said first shifter means comprises:
- a first multiplexer for outputting the N-bit sequence from said fifth latch if the carry signal is applied from said accumulation operation means, and for outputting the N-bit sequence from said sixth latch if not;
- a second multiplexer for outputting the N-bit sequence from said sixth latch if the carry signal is applied from said accumulation operation means, and for outputting the N-bit sequence from said seventh latch if not; and
- a barrel shifter for receiving a 2N-bit sequence constructed so that the N-bit sequence from said second multiplexer is earlier than the N-bit sequence from said first multiplexer, from said first and second multiplexers, and outputting an N-bit sequence starting at a bit position shifted by the accumulated codeword length from said accumulation operation means at a first bit position among the 2N-bit sequence.

5. A variable-length decoder for image signals comprising:
- a decoder for generating a run-length and level corresponding to a variable-length code starting at a first bit position in an N-bit sequence having the longest variable-length codeword of at least bit number N in an input bitstream, generating a first run equivalent signal until a number of clock pulses coinciding with the run-length is input thereto, generating a second run equivalent signal if the number of the clock pulses coincides with the run-length, storing the generated level in response to the first run equivalent signal, and outputting the generated level in response to the generated second run equivalent signal, to thereby decode each variable-length codeword in the input bitstream based on a clock pulse generated according to a constant clock pulse rate;
- first bit storage means coupled to the decoder so as to supply a stored N-bit sequence, for storing the N-bit input sequence for each clock pulse during an input of the second run equivalent signal from the decoder, and keeping the stored N-bit sequence for each clock pulse during an input of the first run equivalent signal;
- codeword length generating means for receiving the N-bit sequence supplied to the first bit storage means and generating and outputting a codeword length corresponding to a variable-length codeword starting at a first bit position in the N-bit sequence for each clock pulse during an input of the second run equivalent signal from the decoder;
- accumulation operation means for adding a previous accumulated codeword length to the codeword length supplied from the codeword length generation means, dividing the added result by the number of bits N, outputting an accumulated codeword length which is a residue according to the divided result, and generating and outputting a carry signal if a quotient exists;
- a buffer for storing the input bitstream, and sequentially outputting the N-bit sequence from the first bit position in the stored bitstream in response to the carry signal from the accumulation operation means;
- second bit storage means for storing at least a 2N-bit sequence output from the buffer in response to the carry signal output from the accumulation operation means;
- first shifter means for outputting an N-bit sequence starting at a bit position shifted by the accumulated codeword length starting at a first bit position of the at least 2N-bit sequence stored in the second bit storage means in response to the carry signal and the accumulated codeword length;
- third bit storage means for storing the N-bit sequence output by the first shifter means for each clock pulse;
- fourth bit storage means for storing the N-bit sequence supplied to the first bit storage means for each clock pulse; and
- second shifter means for outputting an N-bit sequence having a first bit at a bit position shifted by a codeword length output from the codeword length generation means, from the first bit position of the 2N-bit sequence constructed so that the N-bit sequence stored in the fourth bit storage means is earlier than that of the N-bit sequence stored in the third bit storage means, to the first bit storage means, the fourth bit storage means and the codeword length generation means, wherein said decoder comprises:
  - a level table for outputting a level corresponding to a variable-length codeword starting at the first bit position of the N-bit sequence from said first bit storage means;
  - a run table for receiving the N-bit sequence from said first bit storage means and outputting a run-length corresponding to the level output from said level table;
  - comparator means for generating the first run equivalent signal until a clock pulse is generated coinciding with the run-length from said run table and generating the second run equivalent signal if the clock pulse coinciding with said run-length is applied thereto; and
  - an output portion for outputting the level from said level table if said second run equivalent signal is applied thereto, while the level from said level table is not output when said first run equivalent signal is applied thereto.

6. The variable-length decoder according to claim 5, wherein said comparator means comprises:
- a counter for counting each clock pulse and outputting the counted value; and
- a comparator for comparing the run-length from said run table with the counted value from said counter, wherein the second run equivalent signal is generated if the run length from said run table and the counted value from said counter are equal to each other, and the first run equivalent signal is generated if the run length from said run table and the counted value from said counter are not equal to each other, and wherein said second run equivalent signal is supplied as a clear signal of said counter.

7. The variable-length decoder according to claim 6, wherein said comparator generates the second run equivalent signal for a five-clock pulse interval at an initial state.

8. The variable-length decoder according to claim 5, wherein said output portion comprises:

a first latch for storing the level from said level table for each clock pulse;

a second latch for storing the first and second run equivalent signals from said comparator means for each clock pulse; and a third latch for storing and outputting the level supplied from said first latch for each clock pulse when the second run equivalent signal is applied thereto, while outputting a value of data "0" for each clock pulse when the first run equivalent signal is applied thereto.

* * * * *